United States Patent
Kao et al.

(10) Patent No.: US 9,437,627 B2
(45) Date of Patent: Sep. 6, 2016

(54) THIN FILM TRANSISTOR AND MANUFACTURING METHOD THEREOF

(71) Applicant: Chunghwa Picture Tubes, Ltd., Taoyuan County (TW)

(72) Inventors: Chin-Tzu Kao, Changhua County (TW); Wen-Cheng Lu, Taoyuan County (TW); Ya-Ju Lu, New Taipei (TW)

(73) Assignee: Chunghwa Picture Tubes, Ltd., Taoyuan (TW)

( * ) Notice: Subject to any disclaimer, the term of this patent is extended or adjusted under 35 U.S.C. 154(b) by 0 days.

(21) Appl. No.: 14/603,369

(22) Filed: Jan. 23, 2015

(65) Prior Publication Data
US 2016/0172389 A1 Jun. 16, 2016

(30) Foreign Application Priority Data

Dec. 10, 2014 (TW) .............................. 103143163 A

(51) Int. Cl.
*H01L 21/8236* (2006.01)
*H01L 27/12* (2006.01)

(52) U.S. Cl.
CPC ......... *H01L 27/1288* (2013.01); *H01L 27/127* (2013.01); *H01L 27/1214* (2013.01)

(58) Field of Classification Search
CPC .............. H01L 21/707; H01L 21/8254; H01L 29/66969; H01L 29/78606; H01L 29/7869; H01L 27/1288; H01L 27/1214; H01L 27/127
USPC .......... 257/88, 43, 57, 59; 438/278, 30, 151, 438/104
See application file for complete search history.

(56) References Cited

U.S. PATENT DOCUMENTS

| | | | | |
|---|---|---|---|---|
| 8,586,406 B1* | 11/2013 | Wu | ................... | H01L 29/66969 438/104 |
| 2004/0157166 A1* | 8/2004 | Liu | .......................... | G03F 7/40 430/316 |
| 2005/0266594 A1* | 12/2005 | Kaitoh | ................ | H01L 27/1214 438/30 |
| 2007/0238230 A1* | 10/2007 | Chang | ............... | H01L 21/28506 438/151 |
| 2008/0024702 A1* | 1/2008 | Shiau | ................ | G02F 1/136227 349/114 |

(Continued)

FOREIGN PATENT DOCUMENTS

| | | |
|---|---|---|
| TW | 200812089 | 3/2008 |
| TW | 201227836 | 7/2012 |

(Continued)

*Primary Examiner* — Mohammed Shamsuzzaman
(74) *Attorney, Agent, or Firm* — Winston Hsu; Scott Margo

(57) ABSTRACT

A manufacturing method of a thin film transistor includes the following steps. A substrate is provided first. A semiconductor layer is then formed on the substrate. Next, a photoresist pattern including a middle portion and two peripheral portions is formed on the semiconductor layer. The middle portion is disposed between two peripheral portions, and the thickness of the middle portion is greater than each of the peripheral portions. Next, an etching process is performed on the semiconductor layer for forming a patterned semiconductor layer. A photoresist ashing process is then performed to remove at least the peripheral portions of the photoresist pattern to form a channel defining photoresist pattern and expose two portions of the patterned semiconductor layer. Next, the patterned semiconductor layer is treated to form a semiconductor portion and two conductor portions. The channel defining photoresist pattern is then removed.

13 Claims, 20 Drawing Sheets

(56) References Cited

U.S. PATENT DOCUMENTS

| | | | |
|---|---|---|---|
| 2009/0085032 A1* | 4/2009 | Chiu | H01L 27/1288 257/59 |
| 2009/0111199 A1* | 4/2009 | Chang | H01L 27/1214 438/30 |
| 2010/0314634 A1* | 12/2010 | Chiu | H01L 27/1214 257/88 |
| 2013/0119385 A1* | 5/2013 | Kao | H01L 27/1288 257/57 |
| 2013/0181217 A1 | 7/2013 | Hara | |
| 2013/0256665 A1 | 10/2013 | Takeuchi | |
| 2014/0138677 A1 | 5/2014 | Chen | |
| 2015/0162489 A1* | 6/2015 | Kao | H01L 21/707 257/43 |

FOREIGN PATENT DOCUMENTS

| | | |
|---|---|---|
| TW | 201347133 A | 11/2013 |
| TW | 201417186 A | 5/2014 |
| TW | 201421696 | 6/2014 |
| TW | 201442121 A | 11/2014 |

* cited by examiner

| 203 |
|---|
| 202 |

FIG. 14

THIN FILM TRANSISTOR AND MANUFACTURING METHOD THEREOF

BACKGROUND OF THE INVENTION

1. Field of the Invention

The present invention relates to a thin film transistor and a manufacturing method thereof, and more particularly, to the manufacturing method of the thin film transistor with performing a photoresist ashing process to reduce the channel length and to the thin film transistor manufactured by this method.

2. Description of the Prior Art

Thin film transistor (TFT) has been widely applied in the active matrix flat display panel such as the active liquid crystal display panel or the active organic light-emitting diode display panel, wherein the thin film transistor is used as the active device for driving the pixel structure of the display panel. In order to shrink the size of the thin film transistor, the oxide semiconductor materials with high electron mobility have been developed to replace silicon as the material of the channel of the thin film transistor. The oxide semiconductor materials are sensitive to moisture, oxygen and etching solutions, and moisture, oxygen and etching solutions tend to react with the oxide semiconductor materials and thus affect the device characteristics. Accordingly, an etch stop layer is normally formed on the oxide semiconductor material in conventional thin film transistors so that the characteristics of the oxide semiconductor material will not be affected easily, and the thin film transistor with stable device characteristics can be obtained. Therefore, two contact holes in the etch stop layer are required for electrically connecting the oxide semiconductor material to the source electrode and the drain electrode, and the channel length is determined by the distance between the contact holes.

In the conventional manufacturing method of the thin film transistor, the contact holes in the etch stop layer are formed by the lithography and the etching processes, and the distance between the contact holes is limited by the exposure limit of the exposure apparatus. Therefore, the channel length is also limited by the exposure limit of the exposure apparatus, which limits the performance of the thin film transistor.

SUMMARY OF THE INVENTION

It is one of the objectives of the present invention to provide a thin film transistor and a manufacturing method thereof for reducing the channel length of the thin film transistor.

To achieve the purpose described above, the present invention provides a manufacturing method of a thin film transistor. First, a substrate is provided first, and a semiconductor layer is then formed on the substrate. Next, a photoresist pattern is formed on the semiconductor layer, wherein the photoresist pattern includes a middle portion and two peripheral portions. The middle portion is disposed between two peripheral portions, and the thickness of the middle portion is greater than each of the peripheral portions. Later, an etching process is performed with using the photoresist pattern as an etching mask on the semiconductor layer to remove the semiconductor layer uncovered by the photoresist pattern to form a patterned semiconductor layer. A photoresist ashing process is then performed to at least remove the peripheral portions to form a channel defining photoresist pattern and expose two portions of the patterned semiconductor layer. Next, a conductivity-enhancing treatment is performed with using the channel defining photoresist pattern as a mask on the portions to form a semiconductor portion and two conductor portions in the patterned semiconductor layer, wherein the semiconductor portion is disposed between the conductor portions, and the semiconductor portion is covered by the channel defining photoresist pattern for being a channel. At last, the channel defining photoresist pattern is removed.

To achieve the purpose described above, the present invention provides a thin film transistor. The thin film transistor includes a substrate, a patterned semiconductor layer, a gate electrode, a gate insulating layer, a source electrode and a drain electrode. The patterned semiconductor layer is disposed on the substrate, wherein the patterned semiconductor layer includes a semiconductor portion and two conductor portions, the semiconductor portion is disposed between the conductor portions, and the semiconductor portion is connected to the conductor portions. The gate electrode is disposed on the substrate, wherein a width of the semiconductor portion is less than a width of the gate electrode. The gate insulating layer is disposed between the gate electrode and the semiconductor layer. The source electrode and the drain electrode are disposed on the semiconductor layer, wherein the source electrode and the drain electrode contact the conductor portions respectively.

The manufacturing method of the thin film transistor of the present invention reduces the width of the photoresist pattern through forming the photoresist pattern with an uneven top surface. In addition, the width of the photoresist pattern can be reduced by the photoresist ashing process without excess masks to the width which the conventional lithography process is unable to achieve. Moreover, the channel length can be formed to be the same with the width of the channel defining pattern. Thereby, the performance of the thin film transistor manufactured by this method can be effectively improved.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 2-8 are schematic diagrams illustrating a manufacturing method of a thin film transistor according to a first embodiment of the present invention, wherein FIG. 2 is a schematic diagram illustrating a cross-sectional view of a step of forming a semiconductor layer of the manufacturing method of the thin film transistor according to the first embodiment of the present invention;

FIG. 3 is a schematic diagram illustrating a cross-sectional view of a step of forming a photoresist material pattern of the manufacturing method of the thin film transistor according to the first embodiment of the present invention;

FIG. 5 is a schematic diagram illustrating a cross-sectional view of a photoresist ashing process of the manufacturing method of the thin film transistor according to the first embodiment of the present invention;

FIG. 6 is a schematic diagram illustrating a cross-sectional view of a conductivity-enhancing treatment of the manufacturing method of the thin film transistor according to the first embodiment of the present invention;

FIG. 7 is a schematic diagram illustrating a cross-sectional view of a step of forming an etch stop layer of the manufacturing method of the thin film transistor according to the first embodiment of the present invention; and FIG. 8 is a schematic diagram illustrating a cross-sectional view of the thin film transistor according to the first embodiment of the present invention.

FIGS. 9-10 are schematic diagrams illustrating a manufacturing method of a thin film transistor according to a second embodiment of the present invention, wherein FIG. 9 is a schematic diagram illustrating a cross-sectional view of a step of forming a photoresist material pattern of the manufacturing method of the thin film transistor according to the second embodiment of the present invention; and FIG. 10 is a schematic diagram illustrating a cross-sectional view of a photoresist ashing process of the manufacturing method of the thin film transistor according to the second embodiment of the present invention.

FIGS. 14-17 are schematic diagrams illustrating a manufacturing method of a thin film transistor according to a sixth embodiment of the present invention, wherein FIG. 14 is a schematic diagram illustrating a cross-sectional view of a step of forming a semiconductor layer of the manufacturing method of the thin film transistor according to the sixth embodiment of the present invention;

FIG. 15 is a schematic diagram illustrating a cross-sectional view of a conductivity-enhancing treatment of the manufacturing method of the thin film transistor according to the sixth embodiment of the present invention;

FIG. 16 is a schematic diagram illustrating a cross-sectional view of a step of forming a gate electrode of the manufacturing method of the thin film transistor according to the sixth embodiment of the present invention; and FIG. 17 is a schematic diagram illustrating a cross-sectional view of the thin film transistor according to the sixth embodiment of the present invention.

DETAILED DESCRIPTION

Figure 1:
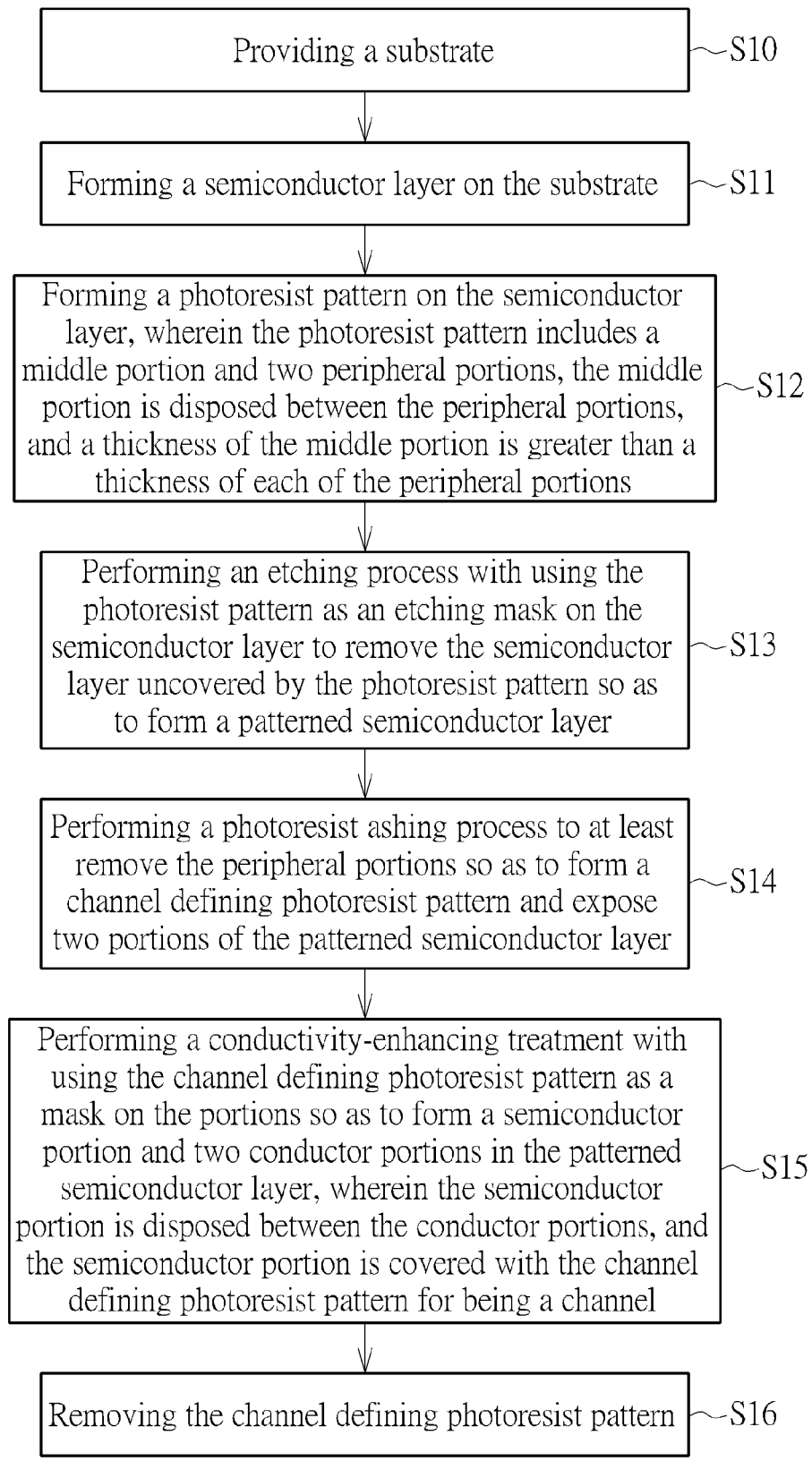
FIG. 1 is a schematic diagram illustrating a process flow of a manufacturing method of a thin film transistor of the present invention.

Please refer to FIG. 1, which is a schematic diagram illustrating a process flow of a manufacturing method of a thin film transistor of the present invention. The manufacturing method of the thin film transistor of the present invention includes following steps:

Step S10: providing a substrate;

Step S11: forming a semiconductor layer on the substrate;

Step S12: forming a photoresist pattern on the semiconductor layer, wherein the photoresist pattern includes a middle portion and two peripheral portions, the middle portion is disposed between the peripheral portions, and a thickness of the middle portion is greater than a thickness of each of the peripheral portions;

Step S13: performing an etching process with using the photoresist pattern as an etching mask on the semiconductor layer to remove the semiconductor layer uncovered by the photoresist pattern to form a patterned semiconductor layer;

Step S14: performing a photoresist ashing process to at least remove the peripheral portions to form a channel defining photoresist pattern and expose two portions of the patterned semiconductor layer;

Step S15: performing a conductivity-enhancing treatment with using the channel defining photoresist pattern as a mask on the portions to form a semiconductor portion and two conductor portions in the patterned semiconductor layer, wherein the semiconductor portion is disposed between the conductor portions, and the semiconductor portion is covered with the channel defining photoresist pattern for being a channel; and Step S16: removing the channel defining photoresist pattern.

With respect to the manufacturing method of the thin film transistor of the present invention, preferred embodiments will be detailed as follows. The preferred embodiments are illustrated in the accompanying drawings to elaborate the thin film transistor and the manufacturing method thereof and functions to be achieved.

Figure 2:
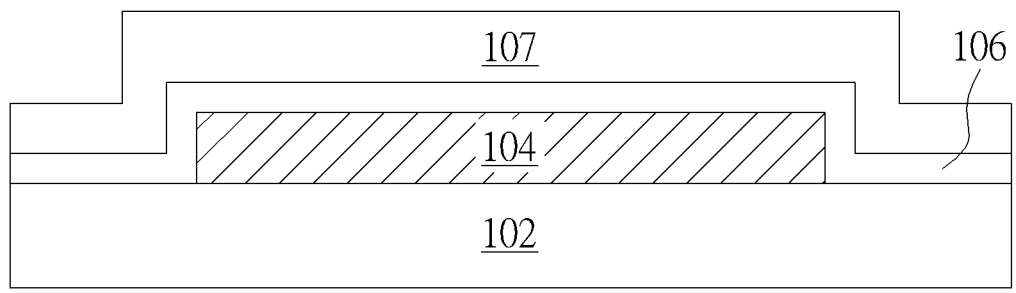

Please refer to FIGS. 2-8. FIGS. 2-8 are schematic diagrams illustrating a manufacturing method of a thin film transistor according to a first embodiment of the present invention. First, as shown in FIG. 2, a substrate 102 is provided. The substrate 102 may be a transparent substrate such as a glass substrate, a plastic substrate or a quartz substrate, but not limited thereto. For example, the substrate 102 may also be an opaque substrate. A first metal layer (not shown) is then formed on the substrate 102, and the first metal layer is patterned to form a gate electrode 104 on the substrate 102. Next, a gate insulating layer 106 is formed on the substrate 102 and the gate electrode 104. The material of the gate insulating layer 106 may be an inorganic insulating material such as silicon oxide, silicon nitride or silicon oxynitride, but not limited thereto. The material of the gate insulating layer 106 may also be an organic insulating material or an organic/inorganic hybrid insulating material. Later, the gate insulating layer 106 is covered with a semiconductor layer 107.

In this embodiment, the material of the semiconductor layer 107 may include at least one oxide semiconductor material such as indium zinc oxide (IZO), aluminum zinc oxide (AZO), indium gallium zinc oxide (IGZO) or other oxide semiconductor materials, but not limited thereto. In other embodiments, the material of the semiconductor layer 107 may also include silicon such as amorphous silicon, polycrystalline silicon, monocrystalline silicon or other suitable semiconductor materials.

Figure 3:
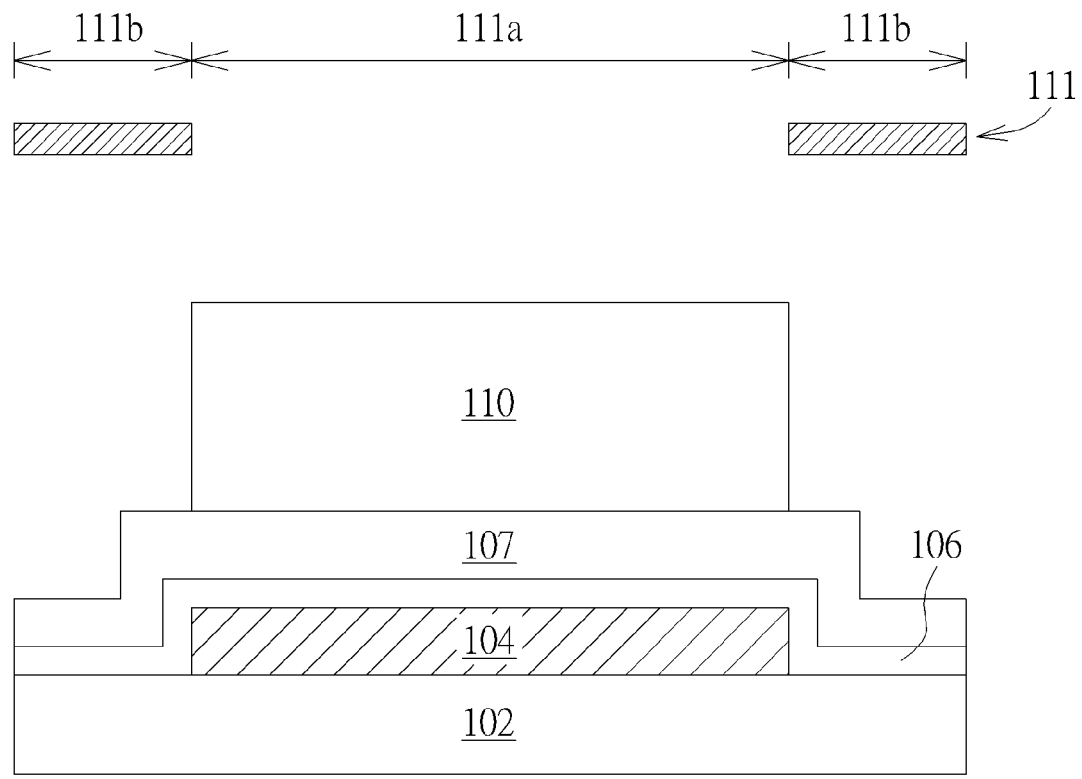

As shown in FIG. 3, after the semiconductor layer 107 is formed, the semiconductor layer 107 is covered by a photoresist material. A lithography process is then performed on the photoresist material with using a mask, to form a photoresist material pattern 110 on the semiconductor layer 107. In this embodiment, the mask used in the lithography process is a binary mask 111, wherein the binary mask 111 may include a transparent region 111a and an opaque region 111b, but not limited thereto. A halftone mask may also be an option for the mask. In addition, a negative photoresist is used as the photoresist material in the following description for an example, but not limited thereto.

After covering the photoresist material, the transparent region 111a is disposed corresponding to the region which a patterned semiconductor layer is desired to be formed, and the opaque region 111b is disposed corresponding to the region which the patterned semiconductor layer is not desired to be formed. Since the photoresist material has the characteristics of the negative photoresist, the photoresist material in the region which the patterned semiconductor layer is desired to be formed will not be removed after exposure, to form the photoresist material pattern 110. The photoresist material pattern 110 may have a substantially flat top surface after the lithography process.

In other embodiments, a positive photoresist may be used as the photoresist material according to requirements, but not limited thereto. In this case, the opaque region is disposed corresponding to the region which the patterned semiconductor layer is desired to be formed, and the transparent region is disposed corresponding to the region which the patterned semiconductor layer is not desired to be formed.

Figure 4A:
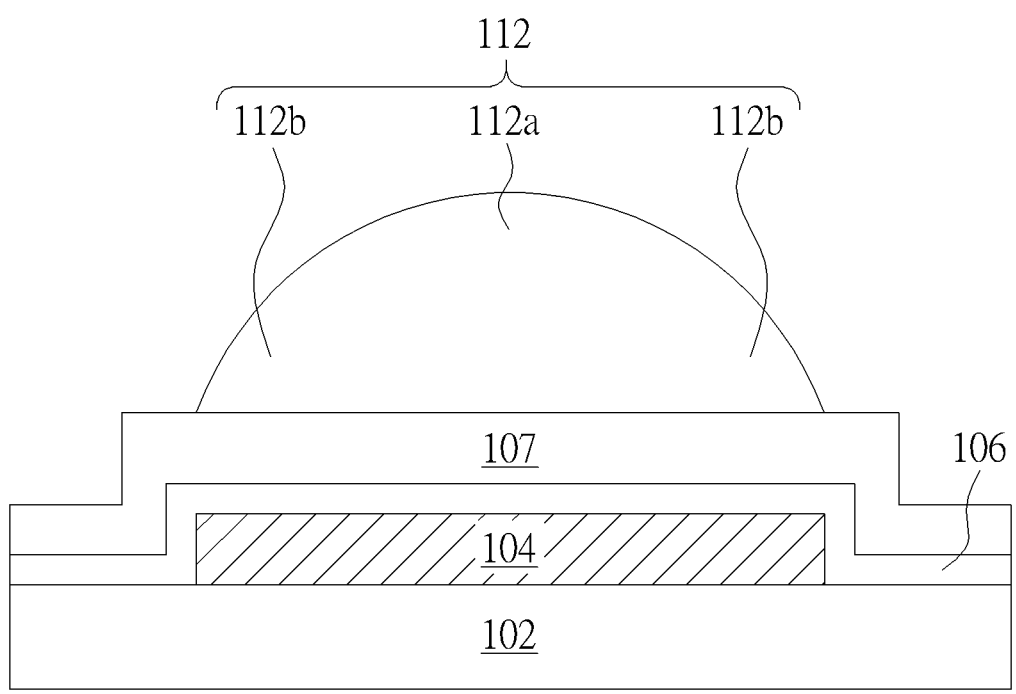
FIG. 4A is a schematic diagram illustrating a cross-sectional view of forming a photoresist pattern by a baking process of the manufacturing method of the thin film transistor according to the first embodiment of the present invention.
Figure 4B:
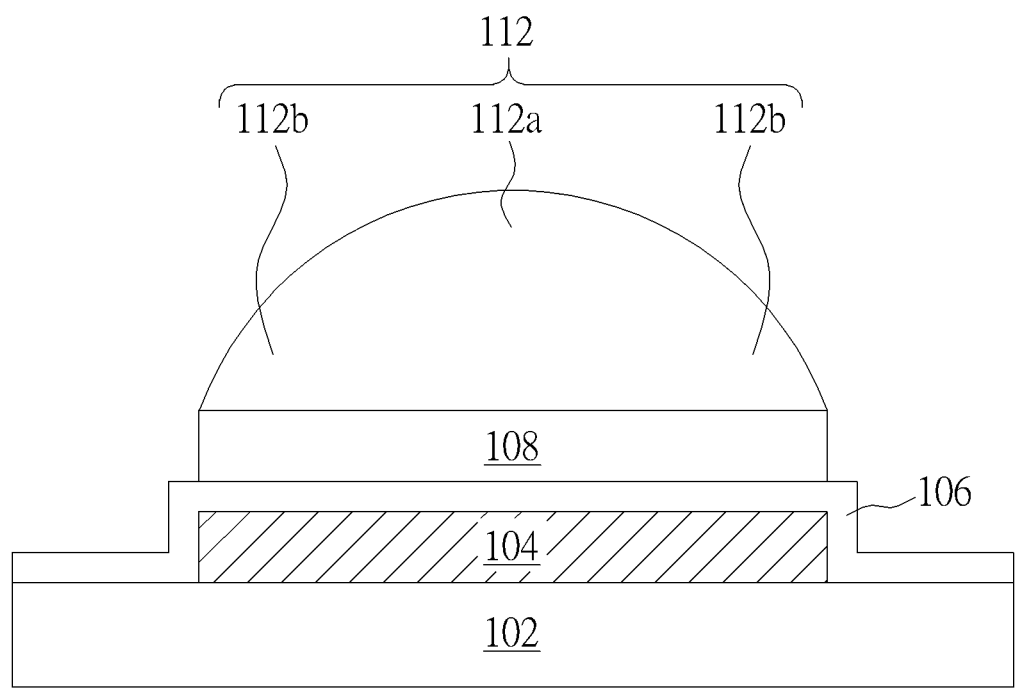
FIG. 4B is a schematic diagram illustrating a cross-sectional view of forming a patterned semiconductor layer by an etching process of the manufacturing method of the thin film transistor according to the first embodiment of the present invention.

Next, as shown in FIG. 4A, a baking process is performed on the photoresist material pattern 110 on the semiconductor layer 107, to form the photoresist pattern 112 having an uneven top surface. The photoresist pattern 112 may include a middle portion (central portion) 112a and two peripheral portions 112b, wherein the middle portion 112a is disposed between the peripheral portions 112b, and a thickness of the middle portion 112a is greater than a thickness of each of the peripheral portions 112b. In this embodiment, the photoresist material pattern 110 having the flat top surface will transfer into the photoresist pattern 112 having the uneven top surface by the baking process at a temperature such as 140° C., but not limited thereto. For example, the uneven top surface of the photoresist pattern 112 may be an arc-shaped top surface. In this case, the thickness of the photoresist pattern 112 will become thinner while closing to the edge. Specifically, the temperature of the baking process in this embodiment may be altered according to different materials of the photoresist material pattern 110, the temperature of the baking process has to be high enough to transfer the photoresist material pattern 110 having the flat top surface into the photoresist pattern 112 having the uneven top surface, and the preferred temperature of the baking process is ranged from 70° C. to 150° C., but not limited thereto. As shown in FIG. 4B, after the photoresist pattern 112 is formed, an etching process is performed with using the photoresist pattern 112 as an etching mask to remove the semiconductor layer 107 uncovered by the photoresist pattern 112, to form a patterned semiconductor layer 108, wherein the patterned semiconductor layer 108 at least overlaps a portion of the gate electrode 104.

Figure 5:
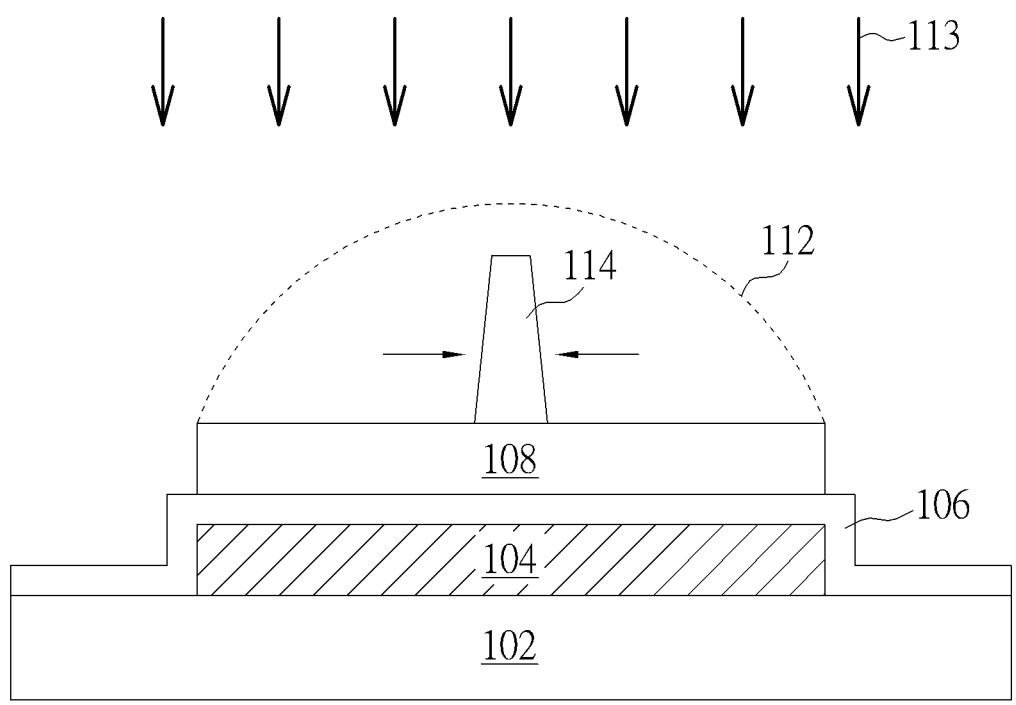

As shown in FIG. 5, after the patterned semiconductor layer 108 is formed, a photoresist ashing process 113 is performed to at least remove the peripheral portions 112b of the photoresist pattern 112 to form a channel defining photoresist pattern 114 and expose two portions of the patterned semiconductor layer 108. In this embodiment, the photoresist material can be removed by reacting with oxygen, therefore the photoresist ashing process 113 may include an oxygen-containing plasma process such as an $O_2$ plasma process or a $N_2O$ plasma process, but not limited thereto. The photoresist ashing process 113 of the present invention may be modified according to different photoresist materials.

It is noteworthy that in the photoresist pattern 112, since the thickness of each of the peripheral portions 112b is less than the thickness of the middle portion 112a, the peripheral portions 112b will be completely removed before the middle portion 112a while the photoresist ashing process 113 is performed on the entire photoresist pattern 112 without using any mask. Accordingly, at least a portion of the middle portion 112a having the greater thickness can remain, which forms a channel defining photoresist pattern 114. Specifically, a width of the channel defining photoresist pattern 114 can be modified by controlling the time duration or the plasma strength of the photoresist ashing process 113, to achieve the desired width. For example, the width of the channel defining photoresist pattern 114 may substantially range from 0.5 microns to 7 microns, but not limited thereto.

Figure 6:
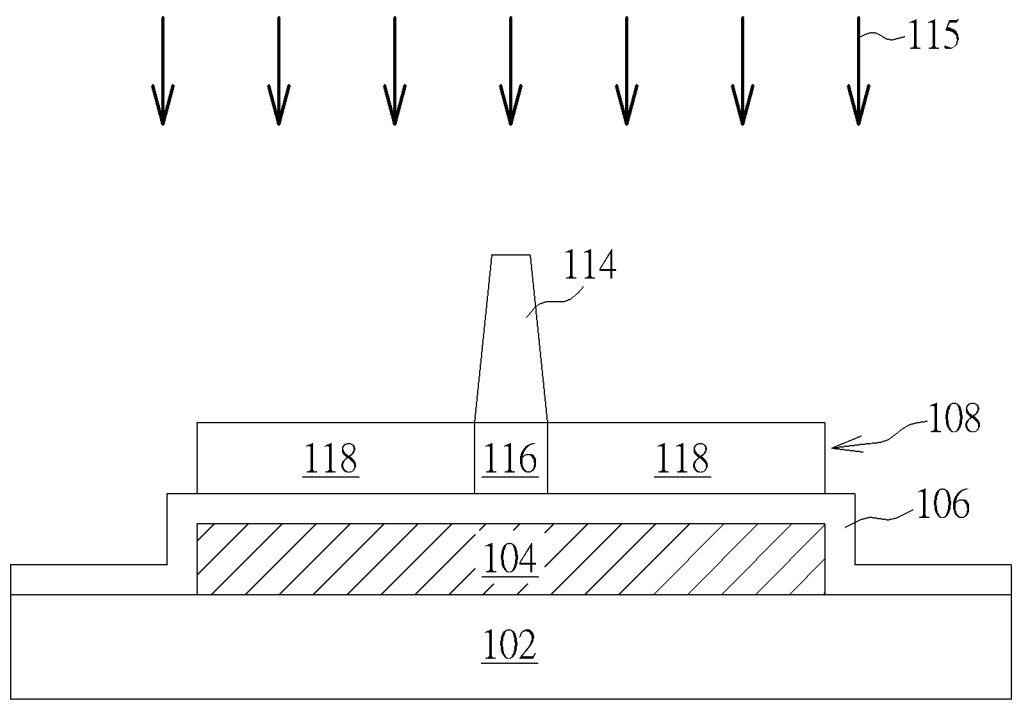

Next, as shown in FIG. 6, a conductivity-enhancing treatment is performed with using the channel defining photoresist pattern 114 as a mask on the portions of the patterned semiconductor layer 108 exposed in the photoresist ashing process 113, to form a semiconductor portion 116 and two conductor portions 118 in the patterned semiconductor layer 108. The semiconductor portion 116 is disposed between the conductor portions 118 and covered with the channel defining photoresist pattern 114, and the semiconductor portion 116 can be used as a channel of the thin film transistor.

In this embodiment, since the conductivity of the oxide semiconductor material can be increased when being reacted with hydrogen, the conductivity-enhancing treatment performed on the patterned semiconductor layer 108 may include performing a hydrogenation treatment 115 on the exposed patterned semiconductor layer 108 so that the hydrogen atoms can enter into the exposed portions of the patterned semiconductor layer 108, thereby enhancing the conductivity of those portions and transferring the exposed portions of the semiconductor layer 108 into the conductor portions 118. In addition, the conductivity of a portion of the patterned semiconductor layer 108 which is covered with the channel defining photoresist pattern 114 is not enhanced, so that the portion forms the semiconductor portion 116. Thus, a conductivity of the semiconductor portion 116 is smaller than a conductivity of each of the conductor portions 118. For example, a resistivity of the semiconductor portion 116 is greater than a resistivity of each of the conductor portions 118, wherein the resistivity of the semiconductor portion 116 may be ranged from $10^{-6}$ ohm-cm to $10^6$ ohm-cm, and the resistivity of each of the conductor portions 118 may be ranged from $10^{-9}$ ohm-cm to $10^{-4}$ ohm-cm, but not limited thereto. For instance, the resistivity of the semiconductor portion 116 may preferably be ranged from $10^{-6}$ ohm-cm to $10^{-4}$ ohm-cm, and the resistivity of each of the conductor portions 118 may preferably be ranged from $10^{-9}$ ohm-cm to $10^{-4}$ ohm-cm. It is noteworthy that the above mentioned range of the resistivity of the semiconductor portion 116 overlaps a portion of the range of the resistivity of each of the conductor portions 118, but the conductor portions 118 of the present invention are formed from the patterned semiconductor layer 108 treated by the conductivity-enhancing treatment. Therefore, the resistivity of each of the conductor portions 118 is less than the resistivity of the semiconductor portion 116, and the resistivity of the semiconductor portion 116 and the resistivity of each of the conductor portions 118 are preferably in the above mentioned ranges respectively.

The method of forming the conductor portions 118 is not limited to the above mentioned. The step of performing the conductivity-enhancing treatment on the patterned semiconductor layer 108 of the present invention may be altered according to the material of the patterned semiconductor layer 108. In this embodiment, the hydrogenation treatment 115 may include a hydrogen plasma treatment or a nitrogen plasma treatment. The hydrogenation treatment 115 may be performed by an apparatus for a process such as a plasma-enhanced chemical vapor deposition (PECVD) or a plasma etching process, but not limited thereto. In addition, a width of the semiconductor portion 116 and a width of the channel defining photoresist pattern 114 are approximately the same which may substantially be ranged from 0.5 microns to 7 microns. It is noteworthy that the width of the semiconductor portion 116 is determined by the width of the channel defining photoresist pattern 114, and a channel length is determined by the width of the semiconductor portion 116. Therefore, the channel length can be effectively reduced by shrinking the width of the photoresist pattern 112 through the photoresist ashing process 113, and further improves the performance of the thin film transistor. In this embodiment, the width of the semiconductor portion 116 can be less than the width of the gate electrode 104, but not limited thereto.

Figure 7:
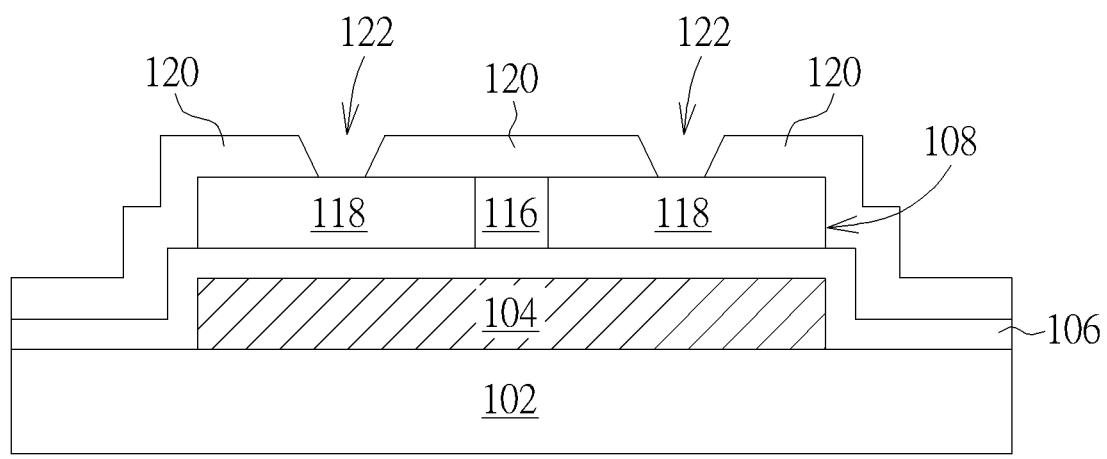

As shown in FIG. 7, the channel defining photoresist pattern 114 is then removed. Next, an etch stop layer 120 is formed on the patterned semiconductor layer 108 and the gate insulating layer 106, wherein the etch stop layer 120 has two contact holes 122, and each of the contact holes 122 exposes the conductor portions 118 of the patterned semiconductor layer 108 respectively. In this embodiment, the step of forming the etch stop layer 120 may include a lithography process and an etching process, to form the contact holes 122.

Figure 8:
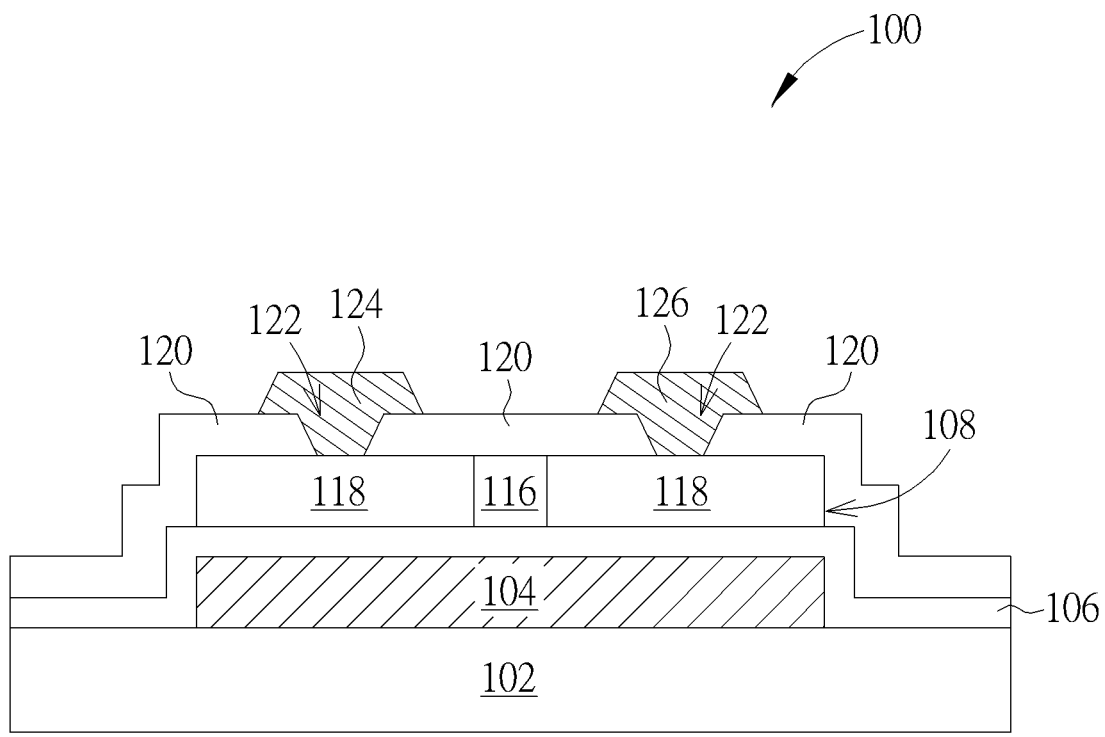

As shown in FIG. 8, the etch stop layer 120 is covered with a second metal layer (not shown) next, and the second metal layer is filled into the contact holes 122. Next, the second metal layer is patterned to form a source electrode 124 and a drain electrode 126 on the etch stop layer 120. The source electrode 124 and the drain electrode 126 can contact the conductor portions 118 via the contact holes 122 respectively, and further electrically connect to the conductor portions 118. A bottom gate type thin film transistor 100 of this embodiment is completed at this time. In this embodiment, the patterned semiconductor layer 108 includes the semiconductor portion 116 and the conductor portions 118, wherein the semiconductor portion 116 is disposed between the conductor portions 118, and the semiconductor portion 116 is connected to the conductor portions 118. Therefore, the conductor portions 118 may be regarded as a source or a drain of the thin film transistor 100, and may further be electrically connected to other devices via the source electrode 124 and the drain electrode 126 respectively.

It is noteworthy that the photoresist material pattern 110 having the flat top surface can be transferred into the photoresist pattern 112 having the uneven top surface by the baking process in the manufacturing method of the thin film transistor 100 in this embodiment. Therefore, the width of the photoresist pattern 112 can be reduced by the photoresist ashing process 113 without excess masks to the width which the conventional lithography process is unable to achieve, and the channel length can be formed to be the same as the width of the channel defining pattern 114. Thereby, the electrical performance of the thin film transistor 100 such as the driving current or the mobility can be effectively improved.

The thin film transistor and the manufacturing method thereof of the present invention are not limited to the aforementioned embodiment. The following description continues to detail other embodiments. To simplify the description and show the difference between the other embodiments and the above-mentioned embodiment, identical components in each of the following embodiments are marked with identical symbols, and the identical features will not be redundantly described.

Figure 9:
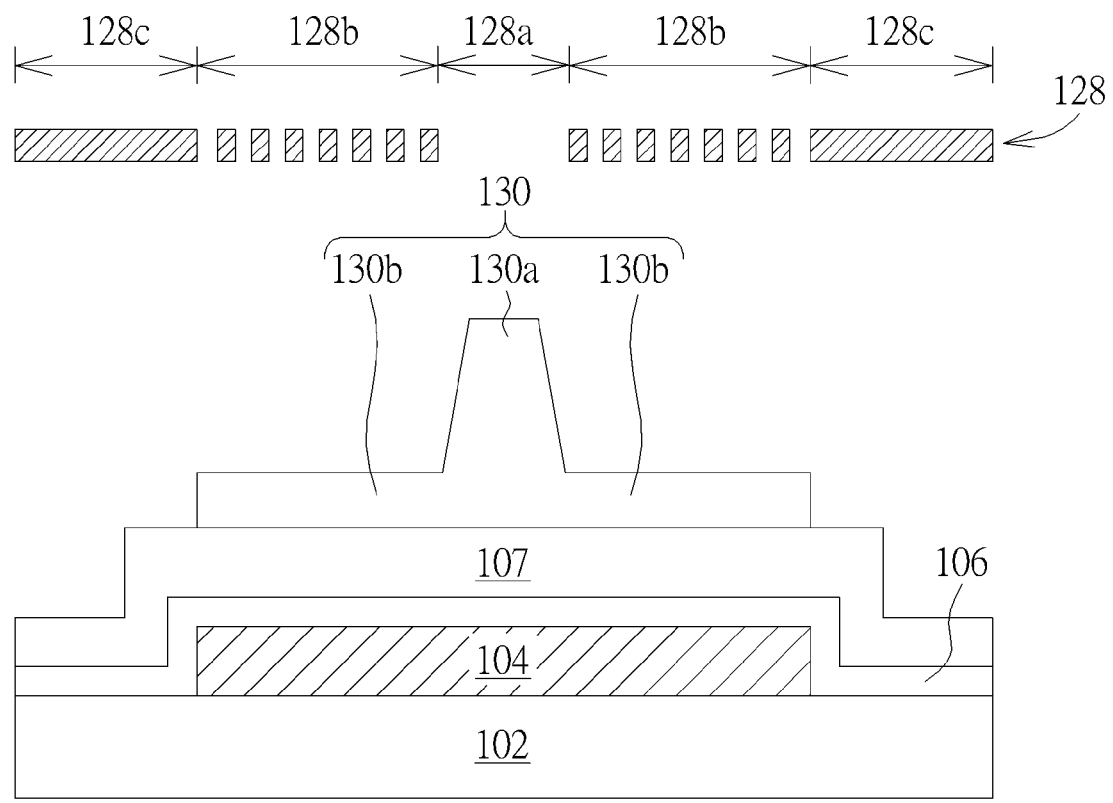
Figure 10:
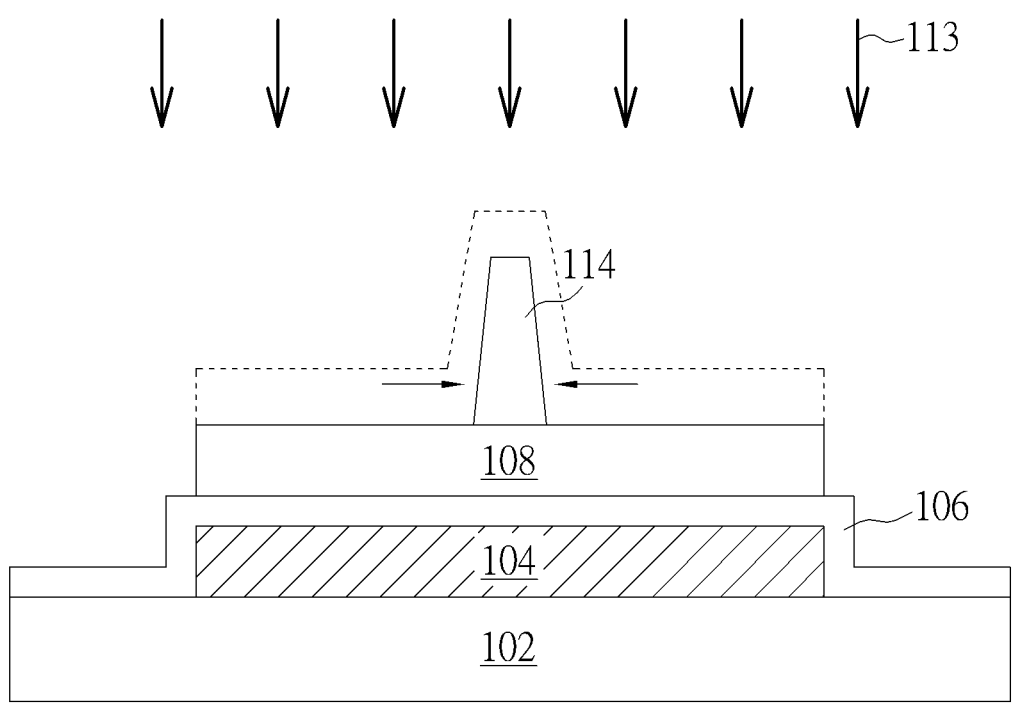

Please refer to FIGS. 9-10, and please refer to FIG. 2 and FIGS. 6-8 together. FIGS. 9-10 are schematic diagrams illustrating a manufacturing method of a thin film transistor according to a second embodiment of the present invention. The manufacturing method of the thin film transistor of this embodiment is basically the same as the method of the above mentioned first embodiment, wherein the difference between them is that a photoresist pattern 130 is formed by another kind of mask and another method in this embodiment. As shown in FIG. 9, the semiconductor layer 107 is covered with a photoresist material, and a lithography process is then performed with using a halftone mask 128 on the photoresist material, to form the photoresist pattern 130 having an uneven top surface on the semiconductor layer 107.

In this embodiment, the halftone mask 128 can include a transparent region 128a, two translucent regions 128b and two opaque regions 128c. A negative photoresist is used for the photoresist material as an example, the transparent region 128a of the halftone mask 128 can be used to form a middle portion 130a of the photoresist pattern 130, the translucent regions 128b of the halftone mask 128 can be used to form peripheral portions 130b of the photoresist pattern 130, and the opaque regions 128c of the halftone mask 128 can be used to remove the photoresist material. In addition, the amounts of exposure to the photoresist material corresponding to the transparent region 128a and the translucent regions 128b of the halftone mask 128 are different, so that a thickness of the formed middle portion 130a is greater than a thickness of each of the formed peripheral portions 130b, and the middle portion 130a and the peripheral portions 130b have a flat top surface respectively.

In other embodiments, a positive photoresist may be used as the photoresist material according to requirements, but not limited thereto. In this case, the halftone mask can include an opaque region, two translucent regions and two transparent regions. The opaque region and the translucent regions of the halftone mask can be respectively used to form a middle portion and the peripheral portions, and the transparent regions can be used to remove the photoresist material.

An etching process is then performed on the semiconductor layer 107, to remove a portion of the semiconductor layer 107 which is uncovered with the photoresist pattern 130 and further to form a patterned semiconductor layer 108. Next, as shown in FIG. 10, a photoresist ashing process 113 is performed on the photoresist pattern 130. The photoresist ashing process 113 at least removes the peripheral portions 130b of the photoresist pattern 130 to form a channel defining photoresist pattern 114 and expose two portions of the patterned semiconductor layer 108.

In this embodiment, a thickness of each of the peripheral portions 130b of the photoresist pattern 130 is less than a thickness of the middle portion 130a of the photoresist pattern 130. Therefore, while the photoresist ashing process 113 is performed on the entire photoresist pattern 130 without using any mask, the peripheral portions 130b will be completely removed before the middle portion 130a, and the remained middle portion 130a further forms the channel defining photoresist pattern 114. Specifically, a width of the channel defining photoresist pattern 114 can be modified by controlling the time duration or the plasma strength of the photoresist ashing process 113, to achieve the desired width.

Since the photoresist ashing process 113 of this embodiment can be the same as the above mentioned first embodiment, the photoresist ashing process 113 will not be redundantly described. The steps of the manufacturing method of the thin film transistor subsequent to the step of forming the channel defining photoresist pattern 114 of this embodiment is the same as the first embodiment, and the steps subsequent to the step of forming the channel defining photoresist pattern 114 shown in FIGS. 6-8 will not be redundantly described.

It is noteworthy that the photoresist pattern 130 having the uneven top surface can be directly formed through the halftone mask 128 in the manufacturing method of the thin film transistor 100 of this embodiment. Therefore, the width of the photoresist pattern 130 can also be reduced by the photoresist ashing process 113 without excess masks to the width which the conventional lithography process is unable to achieve. Thus, the channel length can be reduced and the electrical performance of the thin film transistor 100 can be improved.

Figure 11:
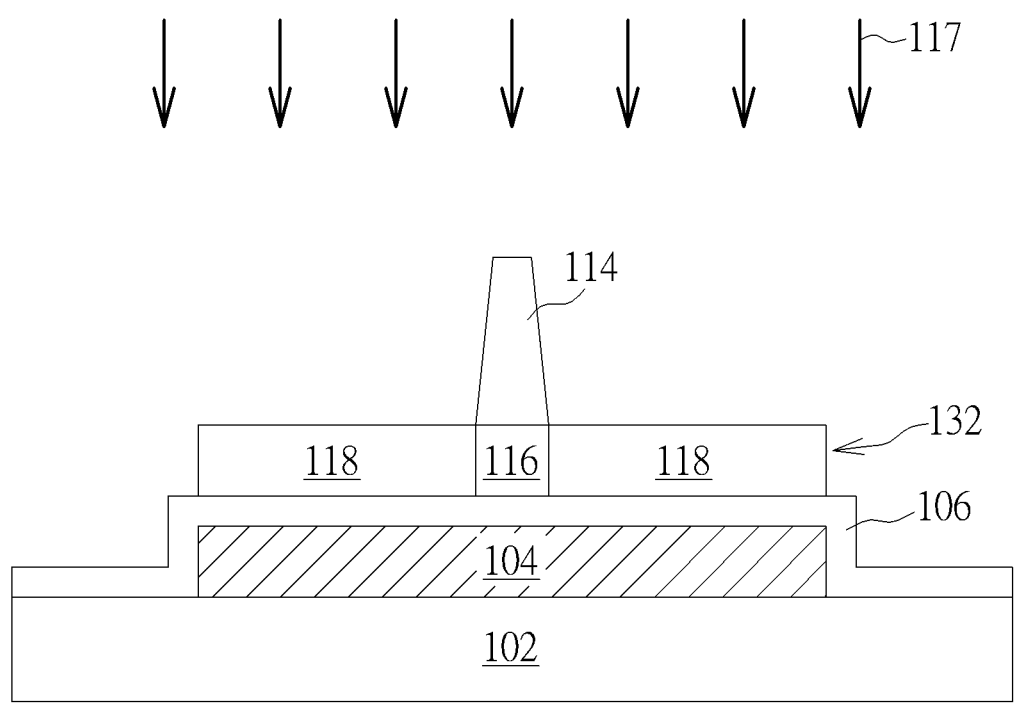
FIG. 11 is a schematic diagram illustrating a manufacturing method of a thin film transistor according to a third embodiment of the present invention.

Please refer to FIG. 11, and please refer to FIGS. 2-5 and FIGS. 7-8 together. FIG. 11 is a schematic diagram illustrating a manufacturing method of a thin film transistor according to a third embodiment of the present invention. As shown in FIG. 11, the difference between the manufacturing method of the thin film transistor of this embodiment and the above mentioned first embodiment is that a material of a patterned semiconductor layer 132 of this embodiment includes silicon such as amorphous silicon, polycrystalline silicon or monocrystalline silicon. Thus, a step of performing a conductivity-enhancing treatment on the patterned semiconductor layer 132 of this embodiment includes performing an ion implantation process 117 to implant a plurality of dopant ions into the portions of the patterned semiconductor layer 132 exposed in the photoresist ashing process, to transfer the portions into conductor portions 118. For example, a resistivity of the semiconductor portion 116 is greater than a resistivity of each of the conductor portions 118, wherein the resistivity of the semiconductor portion 116 may be ranged from $10^{-6}$ ohm-cm to $10^6$ ohm-cm, and the resistivity of each of the conductor portions 118 may be ranged from $10^{-9}$ ohm-cm to $10^{-4}$ ohm-cm, but not limited thereto. For instance, the resistivity of the semiconductor portion 116 may preferably be ranged from $10^{-6}$ ohm-cm to $10^{-4}$ ohm-cm, and the resistivity of each of the conductor portions 118 may preferably be ranged from $10^{-9}$ ohm-cm to $10^{-4}$ ohm-cm. It is noteworthy that the above mentioned range of the resistivity of the semiconductor portion 116 overlaps a portion of the range of the resistivity of each of the conductor portions 118, but the conductor portions 118 of the present invention are formed from the patterned semiconductor layer 132 treated by the conductivity-enhancing treatment, so that the resistivity of each of the conductor portions 118 is less than the resistivity of the semiconductor portion 116, and the resistivity of the semiconductor portion 116 and the resistivity of each of the conductor portions 118 are preferably in the above mentioned ranges respectively.

The step of forming the channel defining photoresist pattern 114 of the manufacturing method of the thin film transistor and the steps performed prior to the step of forming the channel defining photoresist pattern 114 in this embodiment are the same as the above mentioned first embodiment, as shown in FIGS. 2-5, and the steps performed subsequent to the step of performing the conductivity-enhancing treatment on the patterned semiconductor layer 132 are the same as the above mentioned first embodiment, as shown in FIG. 7-8. Accordingly, these steps will not be redundantly described. In other embodiments, the channel defining photoresist pattern may also be formed by the method in the above mentioned second embodiment, but not limited thereto.

Figure 12:
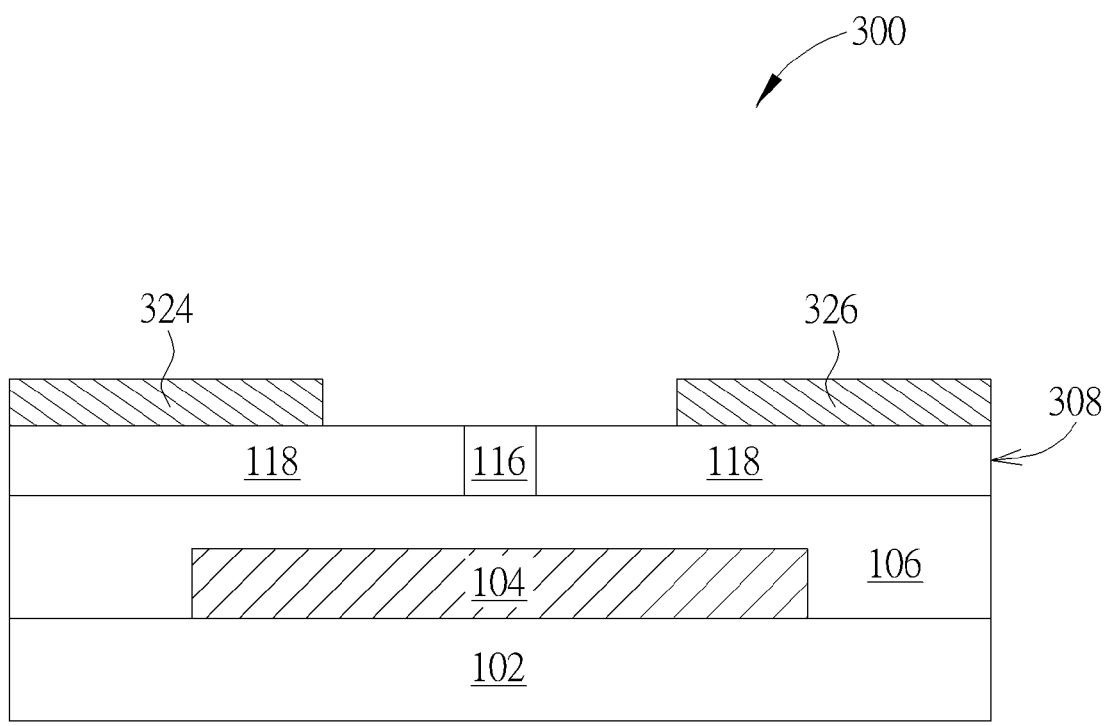
FIG. 12 is a schematic diagram illustrating a cross-sectional view of a thin film transistor according to a fourth embodiment of the present invention.

The structure of the bottom gate type thin film transistor of the present invention is not limited to the above mentioned embodiments. Please refer to FIG. 12. FIG. 12 is a schematic diagram illustrating a cross-sectional view of a thin film transistor according to a fourth embodiment of the present invention. As shown in FIG. 12, a thin film transistor 300 of this embodiment can include an inverted staggered structure. In the thin film transistor 300, no etch stop layer is disposed between a source electrode 324 and a semiconductor layer 308 and between a drain electrode 326 and the semiconductor layer 308, and the source electrode 324 and the drain electrode 326 are disposed on the patterned semiconductor layer 308 directly, but not limited thereto.

Figure 13:
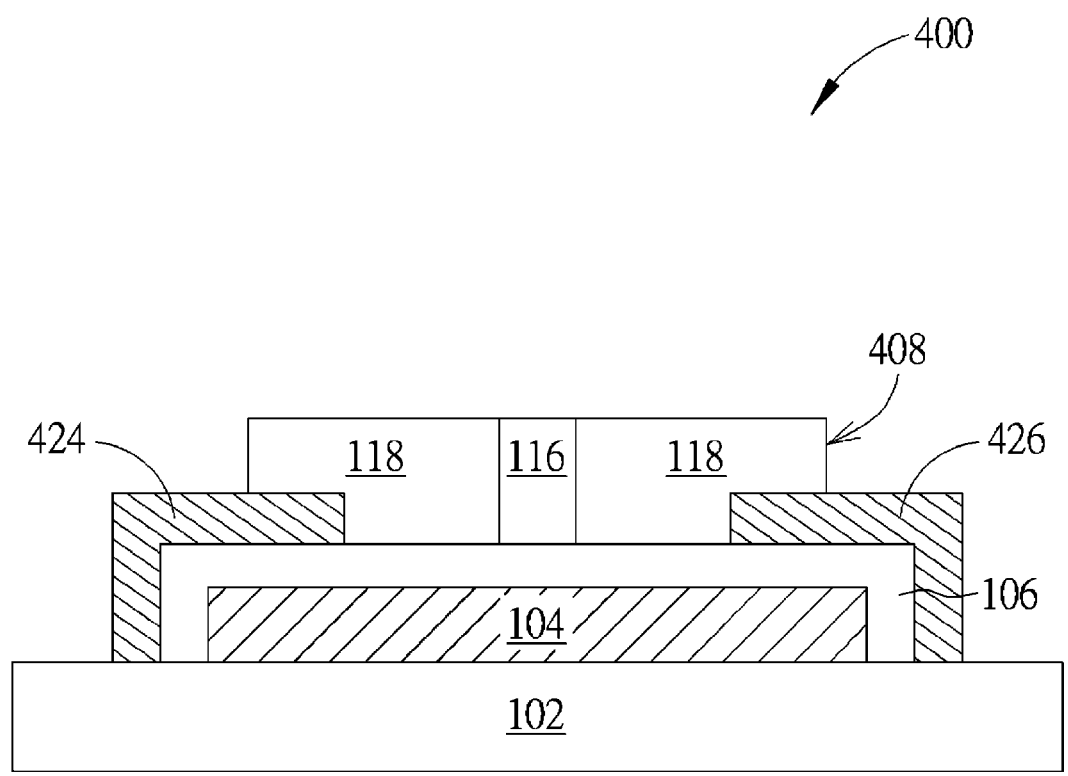
FIG. 13 is a schematic diagram illustrating a cross-sectional view of a thin film transistor according to a fifth embodiment of the present invention.

Please refer to FIG. 13. FIG. 13 is a schematic diagram illustrating a cross-sectional view of a thin film transistor according to a fifth embodiment of the present invention. As shown in FIG. 13, a thin film transistor 400 of this embodiment can include an inverted coplanar structure. In the thin film transistor 400, a source electrode 424 is disposed between a patterned semiconductor layer 408 and a gate insulating layer 106, and a drain electrode 426 is disposed between the semiconductor layer 408 and the gate insulating layer 106, but not limited thereto.

Figure 14:
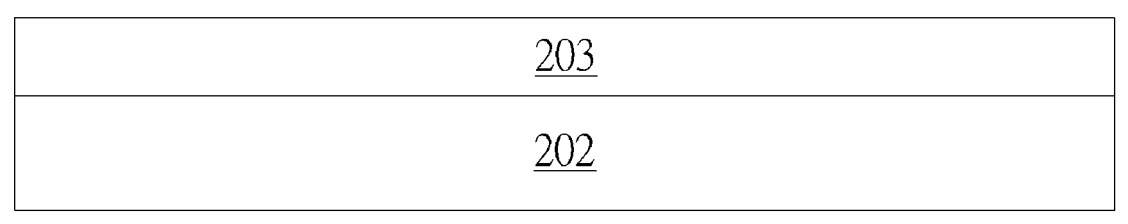

Please refer to FIGS. 14-17. FIGS. 14-17 are schematic diagrams illustrating a manufacturing method of a thin film transistor according to a sixth embodiment of the present invention. The difference between the manufacturing method of the thin film transistor of this embodiment and the manufacturing method of the thin film transistor of the above mentioned first embodiment is that the manufacturing method of this embodiment is used for fabricating a top gate type thin film transistor. First, as shown in FIG. 14, a substrate 202 is provided. The substrate 202 may be a transparent substrate such as a glass substrate, a plastic substrate or a quartz substrate, but not limited thereto. For example, the substrate 102 may also be an opaque substrate. Next, a semiconductor layer 203 is formed on the substrate 202. The material of the semiconductor layer 203 may include an oxide semiconductor material such as indium zinc oxide (IZO), aluminum zinc oxide (AZO), indium gallium zinc oxide (IGZO) or may also include silicon such as amorphous silicon, polycrystalline silicon or monocrystalline silicon, but not limited thereto.

Figure 15:
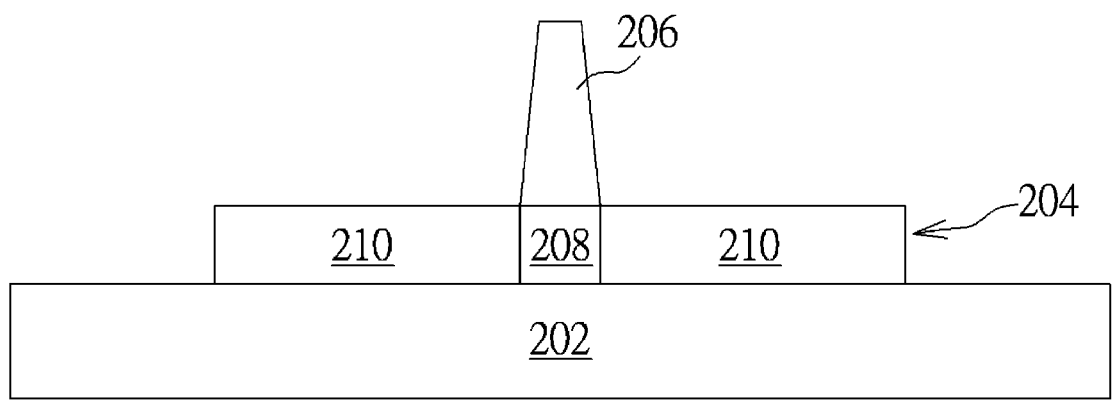

Then, a patterned semiconductor layer 204 can be formed through the lithography process and the etching process in the above mentioned embodiments. Next, as shown in FIG. 15, a channel defining photoresist pattern 206 is formed on the patterned semiconductor layer 204. A conductivity-enhancing treatment is then preformed on the patterned semiconductor layer 204 to form a semiconductor portion 208 and two conductor portions 210. The method of forming the channel defining photoresist pattern 206 of this embodiment may be the same as the above mentioned first or second embodiments, and the conductivity-enhancing treatment performed on the patterned semiconductor layer 204 may be the same as the above mentioned first or third embodiments, so that the steps of forming the channel defining photoresist pattern 206 and performing conductivity-enhancing treatment will not be redundantly described.

Figure 16:
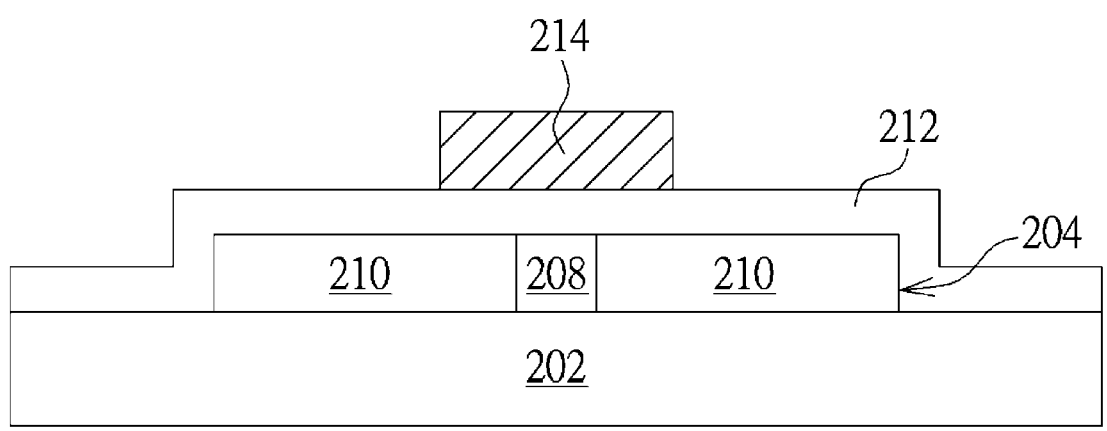

As shown in FIG. 16, the channel defining photoresist pattern 206 is then removed to expose the patterned semiconductor layer 204. Next, a gate insulating layer 212 is formed on the substrate 202 and the patterned semiconductor layer 204. Next, a gate electrode 214 is formed on the gate insulating layer 212, wherein the gate electrode 214 at least overlaps a portion of the semiconductor portion 208.

Figure 17:
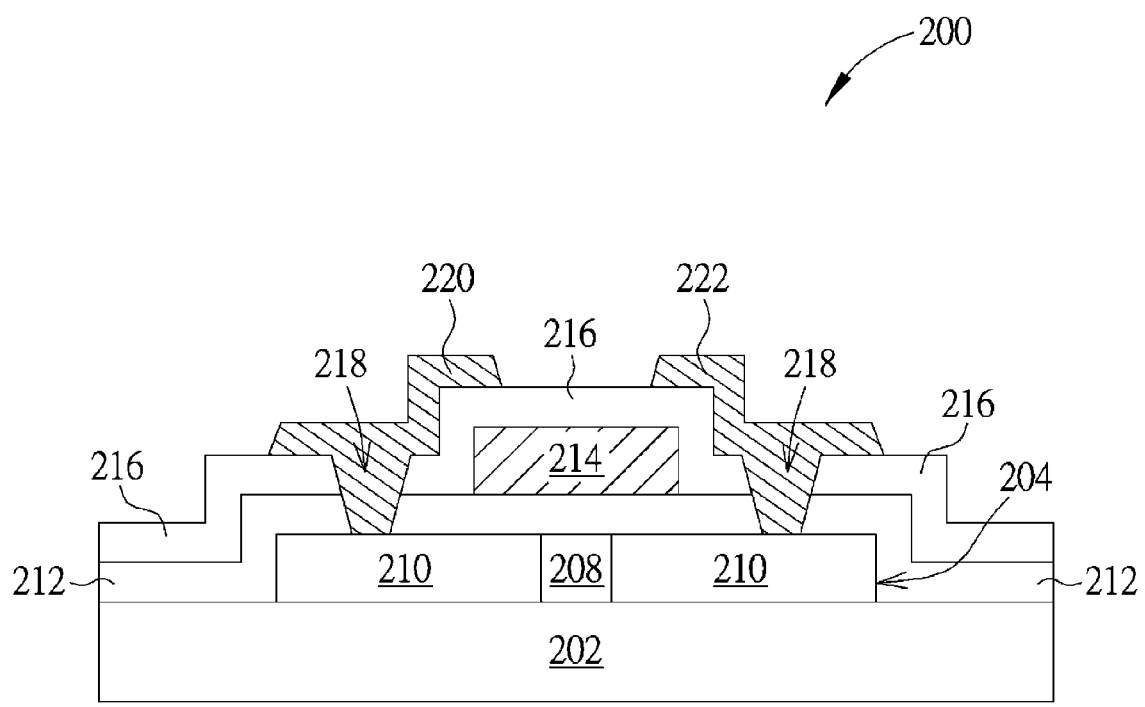

As shown in FIG. 17, an etch stop layer 216 is formed on the gate insulating layer 212 and the gate electrode 214 next. Then, a lithography process and an etching process is performed on the etch stop layer 216 and the gate insulating layer 212 to form two contact holes 218 in the etch stop layer 216 and the gate insulating layer 212, wherein each of the contact holes 218 penetrates the etch stop layer 216 and the gate insulating layer 212. Next, a source electrode 220 and a drain electrode 222 are formed on the etch stop layer 216, wherein the source electrode 220 and the drain electrode 222 are respectively filled into the contact holes 218, and the source electrode 220 and the drain electrode 222 are electrically connected to the conductor portions 210 of the patterned semiconductor layer 204 via the contact holes 218 respectively. A thin film transistor 200 of this embodiment is completed at this time. In this embodiment, the patterned semiconductor layer 204 is disposed between the gate electrode 214 and the substrate 202, and the thin film transistor 200 of this embodiment is the top gate type thin film transistor.

Figure 18:
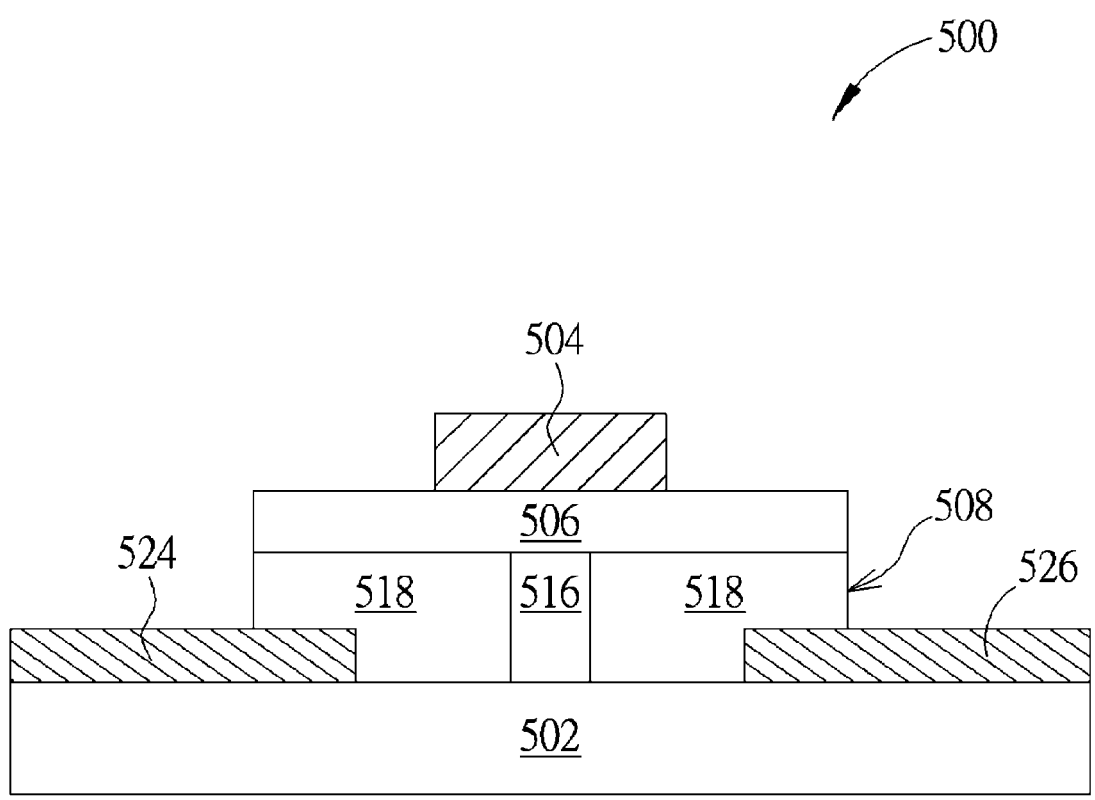
FIG. 18 is a schematic diagram illustrating a cross-sectional view of a thin film transistor according to a seventh embodiment of the present invention.

The structure of the top gate type thin film transistor of the present invention is not limited to the above mentioned embodiments. Please refer to FIG. 18. FIG. 18 is a schematic diagram illustrating a cross-sectional view of a thin film transistor according to a seventh embodiment of the present invention. As shown in FIG. 18, a thin film transistor 500 of this embodiment can include a staggered structure. In the thin film transistor 500, a source electrode 524 is disposed between a patterned semiconductor layer 508 and a substrate 502, and a drain electrode 526 is disposed between the patterned semiconductor layer 508 and the substrate 502, but not limited thereto.

Figure 19:
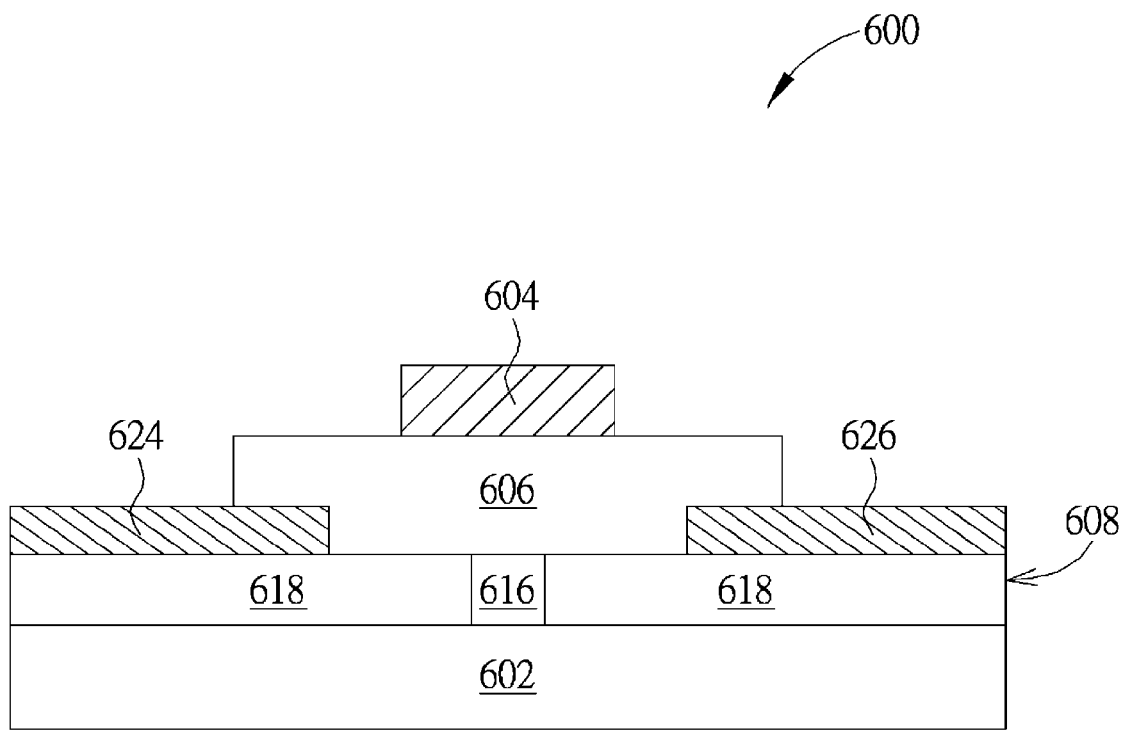
FIG. 19 is a schematic diagram illustrating a cross-sectional view of a thin film transistor according to an eighth embodiment of the present invention.

Please refer to FIG. 19. FIG. 19 is a schematic diagram illustrating a cross-sectional view of a thin film transistor according to an eighth embodiment of the present invention. As shown in FIG. 19, a thin film transistor 600 of this embodiment can include a coplanar structure. In the thin film transistor 600, a source electrode 624 is disposed between a patterned semiconductor layer 608 and a gate insulating layer 606, and a drain electrode 626 is disposed between the patterned semiconductor layer 608 the gate insulating layer 606, but not limited thereto.

In conclusion, in the manufacturing method of the thin film transistor of the present invention, the photoresist material pattern having the flat top surface can be transferred into the photoresist pattern having the uneven top surface by the baking process, or the photoresist pattern having the uneven top surface can be directly formed by the lithography process with the halftone mask. Therefore, the width of the photoresist pattern can be reduced by the photoresist ashing process without excess masks to the width which the conventional lithography process is unable to achieve, thereby forming the channel length which is the same with the width of the channel defining pattern. Accordingly, the electrical performance of the thin film transistor can be effectively improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method of a thin film transistor, comprising following steps:
   providing a substrate; forming a semiconductor layer on the substrate;
   forming a photoresist pattern having an uneven top surface on the semiconductor layer, wherein the photoresist pattern comprises a middle portion and two peripheral portions, the middle portion is disposed between the peripheral portions, and a thickness of the middle portion is greater than a thickness of each of the peripheral portions;
   performing an etching process with using the photoresist pattern as an etching mask on the semiconductor layer to remove the semiconductor layer uncovered by the photoresist pattern to form a patterned semiconductor layer;
   performing a photoresist ashing process to remove the peripheral portions to form a channel defining photoresist pattern and expose two portions of the patterned semiconductor layer;
   performing a conductivity-enhancing treatment with using the channel defining photoresist pattern as a mask on the two portions of the patterned semiconductor to form a semiconductor portion and two conductor portions in the patterned semiconductor layer, wherein the semiconductor portion is disposed between the conductor portions, and the semiconductor portion is covered with the channel defining photoresist pattern for being a channel;
   removing the channel defining photoresist pattern;
   wherein the step of forming the photoresist pattern comprises:
   performing a lithography process with using a binary mask, to form a photoresist material pattern on the semiconductor layer, wherein the photoresist material pattern comprises a flat top surface; and
   performing a baking process on the photoresist material pattern to form the photoresist pattern, wherein a processing temperature of the baking process is ranged from 70° C. to 150° C.

2. The manufacturing method of the thin film transistor according to claim 1, wherein the photoresist ashing process comprises an oxygen-containing plasma process.

3. The manufacturing method of the thin film transistor according to claim 1, wherein forming the photoresist pattern comprises:
   performing a lithography process with using a halftone mask, to form the photoresist pattern on the semiconductor layer.

4. The manufacturing method of the thin film transistor according to claim 1, wherein a material of the semiconductor layer comprises at least one oxide semiconductor material.

5. The manufacturing method of the thin film transistor according to claim 4, wherein performing the conductivity-enhancing treatment on the two portions of the patterned semiconductor layer comprises performing a hydrogenation treatment to transfer the two portions of the patterned semiconductor layer into the conductor portions.

6. The manufacturing method of the thin film transistor according to claim 5, wherein the hydrogenation treatment comprises a hydrogen plasma treatment or a nitrogen plasma treatment.

7. The manufacturing method of the thin film transistor according to claim 1, wherein a material of the semiconductor layer comprises silicon.

8. The manufacturing method of the thin film transistor according to claim 7, wherein performing the conductivity-enhancing treatment on the two portions of the patterned semiconductor layer comprises performing an ion implantation process to implant a plurality of dopant ions into the two portions of the patterned semiconductor layer, to transfer the two portions of the patterned semiconductor layer into the conductor portions.

9. The manufacturing method of the thin film transistor according to claim 1, further comprising forming a gate electrode on the substrate and forming a gate insulating layer on the substrate and the gate electrode between providing the substrate and forming the semiconductor layer.

10. The manufacturing method of the thin film transistor according to claim 9, further comprising:
    forming an etch stop layer on the patterned semiconductor layer and the gate insulating layer after removing the channel defining photoresist pattern, wherein the etch stop layer has two contact holes, and the contact holes exposes the conductor portions respectively; and
    forming a source electrode and a drain electrode on the etch stop layer, wherein the source electrode and the drain electrode are electrically connected to the conductor portions via the contact holes respectively.

11. The manufacturing method of the thin film transistor according to claim 1, further comprising:
    forming a gate insulating layer on the substrate and the semiconductor layer after forming the patterned semiconductor layer;
    forming a gate electrode on the gate insulating layer;
    forming an etch stop layer on the gate electrode and the gate insulating layer;
    forming two contact holes in the etch stop layer and the gate insulating layer, wherein the contact holes respectively expose the conductor portions; and
    forming a source electrode and a drain electrode on the etch stop layer, wherein the source electrode and the drain electrode are electrically connected to the conductor portions via the contact holes respectively.

12. The manufacturing method of the thin film transistor according to claim 1, wherein a width of the channel defining photoresist pattern is ranged from 0.5 microns to 7 microns.

13. The manufacturing method of the thin film transistor according to claim 1, wherein a resistivity of each of the conductor portions is less than a resistivity of the semiconductor portion, the resistivity of the semiconductor portion is ranged from $10^{-6}$ ohm-cm to $10^{6}$ ohm-cm, and the resistivity of each of the conductor portions is ranged from $10^{-9}$ ohm-cm to $10^{-4}$ ohm-cm.

* * * * *